United States Patent
Eickhorn et al.

(10) Patent No.: US 10,725,096 B2
(45) Date of Patent: Jul. 28, 2020

(54) CONTROL AND MONITORING MODULE

(71) Applicant: WAGNER Group GmbH, Langenhagen (DE)

(72) Inventors: Frank Eickhorn, Solingen (DE); Horst Lewonig, Hannover (DE); Florence Daniault, Hannover (DE)

(73) Assignee: WAGNER GROUP GMBH, Langenhagen (DE)

( * ) Notice: Subject to any disclaimer, the term of this patent is extended or adjusted under 35 U.S.C. 154(b) by 43 days.

(21) Appl. No.: 16/051,657

(22) Filed: Aug. 1, 2018

(65) Prior Publication Data

US 2019/0049515 A1 Feb. 14, 2019

(30) Foreign Application Priority Data

Aug. 10, 2017 (EP) ..................................... 17020350

(51) Int. Cl.
| | |
|---|---|
| *G01R 31/28* | (2006.01) |
| *G01R 19/165* | (2006.01) |
| *H01H 9/56* | (2006.01) |
| *G08B 29/12* | (2006.01) |
| *G08B 17/06* | (2006.01) |

(52) U.S. Cl.
CPC ..... *G01R 31/2848* (2013.01); *G01R 19/1659* (2013.01); *G01R 19/16528* (2013.01); *G08B 29/123* (2013.01); *H01H 9/56* (2013.01); *G08B 17/06* (2013.01); *H01H 2009/566* (2013.01)

(58) Field of Classification Search
CPC ............ G01R 31/2848; G01R 19/1659; G01R 19/16528; G08B 29/123; G08B 17/06; H01H 9/56; H01H 2009/566
See application file for complete search history.

(56) References Cited

U.S. PATENT DOCUMENTS

| | | | |
|---|---|---|---|
| 2003/0195673 A1* | 10/2003 | Foch ........................ | G05B 9/03 701/3 |
| 2007/0018534 A1* | 1/2007 | Sciortino .............. | F16K 31/004 310/316.01 |
| 2009/0198459 A1* | 8/2009 | Bilac .................... | H02H 1/0015 702/58 |

(Continued)

FOREIGN PATENT DOCUMENTS

| | | |
|---|---|---|
| EP | 2093737 B1 | 8/2009 |
| EP | 2105898 B1 | 9/2009 |

(Continued)

*Primary Examiner* — Christopher P McAndrew
*Assistant Examiner* — Zannatul Ferdous
(74) *Attorney, Agent, or Firm* — Arent Fox, LLP

(57) ABSTRACT

A control and monitoring module is provided for activating an actuator assigned to the control and monitoring module and for monitoring a signal line and/or a power supply line connected to the control and monitoring module and/or to the actuator. The control and monitoring module is configured to detect a fault in the signal line and/or the power supply line, if, during a simulation executed by a testing device, an actual voltage at the control and monitoring module and/or the actuator exceeds a specified upper voltage threshold value or drops below a specified lower voltage threshold value. A system including the control and monitoring module and a method for operating a control and monitoring module are also provided.

20 Claims, 6 Drawing Sheets

(56) References Cited

U.S. PATENT DOCUMENTS

Figure 1:
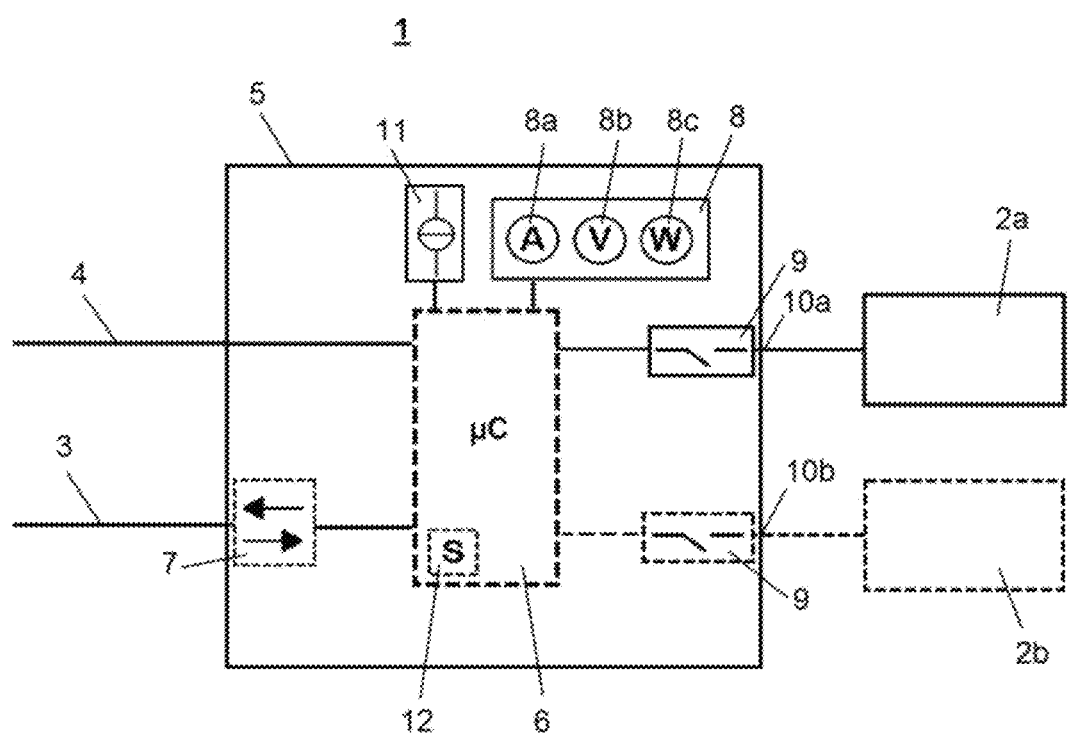

2016/0252556 A1* 9/2016 Kawanaka .......... G01R 31/006
                                              324/549
2016/0308473 A1* 10/2016 Alexander .............. F24F 3/044

FOREIGN PATENT DOCUMENTS

| EP | 2393073 | B1 | | 12/2011 | | |
|----|---------|----|----|---------|----|----|
| EP | 2804163 | B1 | | 11/2014 | | |
| WO | WO-02099444 | A1 | * | 12/2002 | .......... | G01R 31/007 |

* cited by examiner

CONTROL AND MONITORING MODULE

The present invention concerns a control and monitoring module for activating at least one of the actuators assigned to the control and monitoring module and for monitoring at least one signal and/or supply line to the control and monitoring module and/or to at least one actuator.

The invention also relates to a system, especially a fire protection system, which comprises at least one actuator, a system control for supplying the actuator with signals, a power supply unit for supplying the actuators with electrical energy and at least one signal and/or supply line, which runs between system control and/or power supply unit and to at least one actuator, whereby at least one actuator is assigned to a control and monitoring module.

Furthermore the invention relates to a method for operating such a control and monitoring module.

High standards for reliability and operational safety are incumbent on fire protection systems, such as fire avoidance systems, fire alarms and extinguisher systems in order to protect for example industrial facilities, warehousing facilities and other important objects as well as persons from fire. In this meaning fire protection includes on the one hand preventative measures such as reducing the oxygen levels in the areas to be protected. On the other hand, it also includes reactive measures such as activating actuators, which can include alarm systems such as flashing lights, horns or illuminated panels but also for example servomotors for fire safety doors or valves in extinguishing systems. Since reactive protective measures in particular are the most relevant to safety because a fire already exists in these cases and the actuators must function perfectly at all times. But even with preventative measures the reliable function of the actuators must be sufficient at all times to fulfil the fire protection function or in the case of malfunctions of the preventative fire protection system. So for example valves for introducing reduced-oxygen air must be able to open on demand at any time, in order to assure a reduced oxygen content in the protected area as is required to meet the required for preventative fire protection. Should the reduced oxygen content drop below a concentration that is hazardous to human health due to a technical fault in the fire protection system, the same valves must reliably close in order stop the introduction of reduced-oxygen air. Additionally it must be possible to reliably engage the alarm systems in such a case in order to warn people and tell them to leave the protected area.

As a rule such actuators shall be controlled by corresponding system controls of a fire protection system over supply and signal lines, usually two-wire or multi-wire lines, whereby in the event of an incident, control voltage shall be supplied to the actuators in conformity to the specifications. The incident can for example be a fire incident i.e. a fire detection signal triggered by a fire detector or hand-held fire alarm.

Because actuators of this kind in a fire protection system are only rarely engaged—in the ideal case, never —, the challenging part is to secure the concrete operating status of the actuator and/or the signal and/or supply line in the fire protection system constantly and especially without any detriment to the normal daily routine in the area of the fire protection system. Of course it would be possible to check the actuators of the fire protection system at regular intervals through test activations; however, the persons who are in the range of the fire protection system would have to be appropriately prepared.

The standard EN 54-13 2005, the draft standard EN 54-2 2016 and the VdS 3156 2012 Electrical system controls for oxygen-reducing systems considerably increased the requirements for effective functioning of a wired transmission path for an alarm system and/or oxygen-reducing system. According to EN 54-13 2005, it is no longer that a fault must be reported if there is a complete interruption of the transmission pathway, that is, if there is an infinite line resistance indicative of a line break, but already when, or before a line of a fire alarm system can no longer carry out an activating function. This can be established in that the actuators connected to the fire alarm system, especially a large number of alarm units, suddenly and simultaneously start consuming a large amount of electrical power and already slightly increased or reduced line resistance can lead to this power no longer being adequately supplied over the transmission path. Increased or reduced line resistance can arise for example over time through moisture, fouling and corrosion in sections of the conductor sections or contacts for which reason this effect is often referred to as a "creeping break" and/or "creeping short circuit". For this reason, the EN 54-13 2005 requires that a fault message be sent starting at a line resistance, at which the reliable control can no longer be assured over a given transmission path. The standard assumes a tight tolerance limit of 10%: At a value of 0.9 and/or 1.1 of the resistance value that is set as too high or too low, the actuator control must still function perfectly and without sending a fault message. Correspondingly there is the requirement that the line resistance in the transmission paths be precisely monitored and any drop below or spike above an upper or lower resistance limit value must trigger a fault message. It follows from this that a system compliant with the standard must make sure that every transmission path delivers at least the necessary power for the function of this component under the intended load conditions. If the power is too low, the supply of the required load current would be detectable due to a drop in voltage.

The EP 2105898 A2 describes a method for testing a wired transmission path in an alarm system for inadmissible high resistance by generating a current on the transmission path that terminates with an end of line module. The end of line module generates the current, measures and compares the voltage at the end of line module with a target value and generates an error message if the target value is not met. As stipulated by the invention, the current will be generated rising to the pre-determined value, for example in the form of a current ramp. Furthermore, a corresponding alarm system with a central unit, a line and end of line module is described, whereby the end module checks the line for faults from short circuits or inadmissible high resistance.

EP 2804163 A1 describes a method and a device for the measurement of a line resistance and for identifying faults in control lines in an alarm and control system whereby the control lines connect a control device with an actuator and the control device controls the actuator in an incident by means of actuation voltage. A monitoring module is arranged on or in the actuator. The invention does not exclude configurations with multiple actuators. The control device comprises a current sink that can be engaged over a microcontroller or a switchable load resistance. During a line test, the power supply for the actuators will be shut off by the control device and a constant power supply will be provided by an energy storage device, e.g. a capacitor, from the monitoring module.

A disadvantage of known methods and devices used for line monitoring and testing is that the testing and monitoring mechanisms that are used are not capable of handling the complexity and individuality of the monitored systems and therefore can only be adapted to them with considerable effort or lead to unreliable results, for example, they do not send a fault message in spite of increasing or decreased line resistance or vice versa they falsely indicate a (non-existent) fault when there is no critical change in line resistance. Additionally, the known methods and devices are inflexible in cases of a change in the monitored fire protection system, like when an actuator is added or removed.

The basic task of the invention is to specify a more flexible control and monitoring module for activating at least one actuator assigned to the control and monitoring module and for monitoring a signal and/or supply line to the control and monitoring module and/or to at least one actuator, whereby this control and monitoring module is so constituted that it monitors at least one signal and/or supply line with high reliability for line resistance that is increased or decreased to a degree that it endangers a control function according to the standard EN 54-13 2005.

Another task of the present invention is to provide a system, especially a fire protection system, which comprises at least one actuator as well as a system control for supplying at least one actuator with signals, a power supply unit for supplying at least one actuator with electrical power, and at least one signal and/or supply line, which runs between the system control and/or the power supply unit and at least one actuator, whereby this system, especially fire protection system, is designed to monitor with high reliability and flexibility any increased or decreased line resistance of the signal and/or supply line that would endanger control functions according to the standard EN 54-13.

Furthermore, a corresponding method should be stated for operating a control and monitoring module.

With respect to the control and monitoring module, the underlying task of the invention is solved by a control and monitoring module for activating at least one actuator assigned to the control and monitoring module and for monitoring at least one signal and/or supply line to the control and monitoring module and/or to the at least one actuator, whereby the control and monitoring module comprises the following:
  a control device for activating the at least one actuator;
  a measuring device for determining the current and/or power consumption of the at least one actuator and for determining the actual voltage at the control and monitoring module and/or the actuator; and
  a testing device for simulating the current and/or power consumption of the least one actuator,
whereby the control and monitoring module is designed to detect a fault in the at least one signal and/or supply line, if, during a simulation executed by the testing device, an actual voltage at the control and monitoring module and/or the actuators exceeds a previously specified upper voltage threshold value or drops below a previously specified lower voltage threshold value. With respect to the system, especially the fire protection system, the underlying task is solved by the system, especially a fire protection system, which comprises the following:
  at least one actuator;
  a system control for supplying the actuators with signals;
  a power supply unit for supplying the actuators with electrical power;
  at least one signal and/or supply line, which runs between the system control and/or the power supply unit and the at least one actuator;
whereby a control and monitoring module is assigned to the at least one actuator, especially a control and monitoring module as described herein, whereby the control and monitoring module is especially designed to monitor the at least one signal and/or supply line for faults and/or to control the at least one actuator and/or to simulate the activation of the at least one actuator. With respect to the method, the task underlying the invention is solved by a method for operating a control and monitoring module for activating at least one actuator assigned to the control and monitoring module and for monitoring at least one signal and/or supply line to the control and monitoring module and/or to the at least one actuator, especially for operating a control and monitoring module as described herein, whereby the method comprises the following method steps:
a) activating the at least one actuator and determining a current and/or power consumption of the at least one actuator in a learning mode (A);
b) simulating the current and/or power consumption of the at least one actuator determined in the learning mode (A) and also determining the actual voltage at the control and monitoring module and/or to the actuator in a preferably cyclically-initiated monitoring mode (D);
c) activating the at least one actuator in an activation mode (C) initiated as needed.

Thus, the control and monitoring module according to the invention encompasses a control unit for activating at least one actuator, a measuring unit for determining the current and/or power uptake of at least one actuator and for determining the voltage at a control and monitoring module and/or to the actuator, as well as a testing device for simulated a current and/or power consumption of at least one actuator. The control and monitoring module is so constructed that a fault in at least one signal and/or supply line to the control and monitoring module and/or to at least one of the actuators assigned to the control and monitoring module will be detected if the actual voltage at the control and monitoring module and/or the actuator exceeds a previously specified upper voltage limit or drops below a previously specified lower voltage limit during a simulation initiated by the testing device.

The control and monitoring module according to the invention provides a surprisingly easy way of obtaining an particularly certain and reliable conclusion about the effective functioning of the signal and supply lines through simulating a loadcase under real and individual conditions. The line test and monitoring is not done as in the state of the art based on theoretical assumptions and calculations of predicted loadcases, but instead based on actually measured current and/or power consumption of the actuators involved which can also vary depending on the time in their switched on state, and taking into account the actual types and lengths of wires laid. By adjusting the measured electrical values it is possible to simulate a real loadcase precisely and check the power available for activating the actuators based on the actual voltage at the actuators and/or the control and monitoring module.

The control and monitoring module is for example a compact device with a housing and a circuit board, on which among other things the control, measuring and testing device as well as the necessary connections for the signal and supply lines and actuator outputs are located. Additionally, configuration switches and LED-indicators for visualizing the device's status can be located on the module. The control and monitoring module is preferably located in the immediate proximity or directly on the actuators. This assures that nearly the entire transmission path for electrical signals and power is monitored by the module.

The activating unit for the control and monitoring module in its simplest form is a switch, for example a relay, a switch contact or even an electronic switch like a transistor. The activating unit serves to switch through the electrical power coming from the signal and supply line at the control and monitoring module in order to activate at least one actuator for it. The one actuator thus activated is therefore only supplied with power when the activating unit is activated.

The measuring unit includes measuring circuits for measuring the electrical parameters such as current strength, power and/or voltage. The measured values can for example be processed by means of a module controller, like in the form of a microcontrollers or microprocessor in the control and monitoring module and compared with the respective upper and lower limits. The measurements can be done selectively during a measuring process but preferably continuously or cyclically, e.g. once a minute, and with a measurement duration of 10 to 20 seconds for example. Of course a shorter measurement duration in the range of milliseconds is also conceivable.

The testing device for simulating current or power consumption of at least one actuator is an adjustable ohmic or electronic load, for example a current sink. It serves to imitate the measured, actual energy consumption previously measured by the measuring unit for the one actuator and thereby replace a real control of the actuator in the context of a line test. The testing unit can be controlled for example by means of a module controller, like using a microcontroller or microprocessor, so that it sets the simulation values for the electrical values at the testing unit based on the previously processed measurements from the measuring units.

A fault in at least one signal and/or supply line is understood as an inadmissible high resistance or an inadmissible low resistance according to the standard EN54-13 2005. In this context the term "inadmissible" means it is possible that the required control function can no longer be assured starting from a too high or too low resistance, because the change in resistance renders the electrical power that can be transmitted over the signal and/or supply line to actuators no longer sufficient.

Preferably the control and monitoring module generates an error and fault message if it repeatedly and especially in succession detects a fault in the signal and/or supply line. This makes sure that there really is a fault in the signal and/or supply line and there is no erroneous fault report owing to a temporary error in the simulation or the measurement. This configuration can for example be implemented by means of an internal fault counter in the control and monitoring module.

Following a further development of the control and monitoring module pertaining to the invention, it is also trained to detect a fault in at least one signal and/or supply line if, when activating the at least one actuator
- the current consumption of the at least one actuator exceeds a previously specified upper current limit or drops below a previously specified lower current limit and/or
- if the current consumption of the at least one actuator exceeds a previously specified upper current power limit or drops below a previously specified lower power limit; and/or
- if the actual voltage at the control and monitoring module and/or the actuator exceeds a previously specified voltage limit or drops below a previously specified voltage limit.

Thus it is not only possible to detect a fault by means of a simulation of the current and/or power consumption of the at least one actuator carried out by the testing unit, but also by actually activating the actuators through activating and/or switching the control unit. This makes it possible for example to detect a defective actuator. To this end the measuring unit of the control and monitoring module measures the current and/or power consumption of the least one actuator as well as the actual voltage at the control and monitoring module and/or to the actuator during activation and compares it with the previously specified lower and/or upper limits. If a limit is repeatedly and in succession exceeded or not met a fault, e.g. a "line fault" or an "actuator fault" will be reported.

According to preferred embodiment of the control and monitoring module in the invention, the control and monitoring module also has a memory storage device. It can on the one hand store the previously specified limits for the factors current, voltage and/or power, and on the other also the values for these factors as determined by the measuring device. Preferably the memory storage unit is a non-volatile microelectronic memory, for example a memory chip or integrated circuit (IC). The memory storage device can be specifically integrated into a module control unit, e.g. in a microcontroller.

According to the preferred embodiments, the control unit is configured in a learning mode and/or activation mode to activate the at least one actuator. Preferably the measuring device is taught in the learning and/or activation mode to determine the current—and/or power consumption of the at least one controlled actuator. The testing device can be designed to simulate the detected current and/or power consumption of the at least one actuator in a monitoring mode. In the monitoring mode the measuring will preferably measure the actual voltage at the control and monitoring module and/or the at least one actuator.

Since the control and monitoring module can be operated in various operating conditions such as in a learning, an activation or a monitoring mode, it can fulfil with particular reliability the different tasks required for control and circuit monitoring. In the learning mode, the control and monitoring module "learns" the behavior of the actuator during a real actuation event, in that it measures the current and/or power consumption of the activated actuator. In a monitoring mode, the testing device simulates the values previously learned in learning mode for generating an electronic load, for example an electrical current or an electrical output. In an activation mode, the module really controls the at least one actuator, because for example alarms or valves have to be activated due to a detected hazard. The signal for a change of control and monitoring module to a different mode can be generated inside the module, e.g. through a module control in the form of a microcontrollers, like when the module switches to monitoring mode after an initial, time-limited learning mode. The signal for a mode change can be sent to the control and monitoring module however also over the signal and/or supply line monitored by the control and monitoring module, for example if the actuators need to be activated because of a hazardous incident and control and monitoring module is supposed to switch to activation mode for this purpose.

Basically it is an advantage if the measuring device is designed to also determine the actual voltage at the control and monitoring module and/or the at least one actuator in a learning mode and/or activation mode. This makes both the increased reliability of detecting a line fault possible, for example, detecting a possible actuator fault during an alarm or control process. Thus it is possible in a basically intact signal and/or supply line with a short circuit to reliably detect this fault through an actuator during a control process.

In accord with the preferred embodiments of the current invention, the measuring device is designed to detect in the learning mode a chronological sequence and/or an effective value for the current and/or power consumption of the actuator, whereby the testing device is designed to simulate in the monitoring mode the detected effective value or the calculated chronological sequence of current and/or power consumption of the at least one actuator. Through exactly measuring and emulating a chronological sequence of a current and/or power consumption, an particularly precise and realistic simulation of a loadcase is possible, so that the highest demands for an exact line monitoring can be fulfilled. The chronological sequence can be a regular sequence, for example in the form of a sawtooth curve. The function of the current and/or power consumption depending on time can however just as well evince an irregular progression. By deriving an effective value from the measured absolute values, the simulation of the measured current and/or power values by contrast is practically simplified. The term effective value refers to the value of an electrical factor which spends the same power and/or the same electrical output on a consumer in a representative time span, for example 10 to 20 seconds. Of course a shorter measurement span in the range of milliseconds is conceivable. The effective value formation can for example be software-based or realized by means of already known discrete circuits. In principle, other values such as the measured maximum value of the current and/or output of a simulation could be used as a basis by the testing device. However, the calculation and the emulation of an effective value have proven especially practicable.

In an particularly preferred embodiment, the testing device for the control and monitoring module is a controllable current sink. It can be in one particularly simple configuration be an operational amplifier and for example convert an analog signal generated by a microcontroller into the current signal used for the line test. This way the simulation of current and/or power consumption of the at least one actuator can be implemented with little effort and low costs.

According to an advantageous embodiment, the control and monitoring module also has a communication device, specifically a bus interface. Using this bus interface, the control and monitoring module is or can be connected with a system control. This system control can for example be part of a fire protection system and exchange information over a bus with components of the fire protection system. In one example the system control is a central fire alarm unit and the bus participants are fire detectors and actuators like alarms. Data buses can be present in such systems in different topologies, for example as branch lines or ring lines ("loop"). The data transfer over the bus can be effected using different communications protocols, for example following a TCP/IP-protocol or a modbus protocol (Modbus RTU, Modbus TCP). Manufacturers of fire alarms and fire alarm systems especially use manufacturer-specific protocols for communication between the fire alarms and a central fire alarm unit. The bus interface of the control and monitoring module is therefore to be selected to be compatible with the bus topology and the communications protocol used, for example in the case of a Modbus-RTU-Protocol as an RS 485-interface. Of course other buses, protocols and bus interfaces are conceivable. The preference here is for a serial interface such as according to the RS 485 or RS 232 Standard or other widely used communications interfaces such as Ethernet or CAN-Bus.

By providing a bus interface in the control and monitoring module, an up-to-date networking of the module with controls and components of systems, especially fire protection systems, are realized and an exchange of data between the module and other network participants can take place, e.g. the transfer of values determined by the measuring device, the transmission of fault messages to a control unit or the transmission of limits set in a control unit to one or more control and monitoring modules.

In a preferred embodiment the control and monitoring module also contains a preferred integrated module control for signal and/or power supply of or for communication with the control unit, the measuring device, the testing device, the preferably integrated, optional memory storage device and/ or the optional communication device. The module control device serves to control important parts of the control and monitoring module such as the control unit, the measuring device or testing device as well as to evaluate the data from the measuring device, for example to compare them with the limits stored in a memory storage device. The module control device is a preferably a programmable module, for example a programmable logic device, a microcontroller or microprocessor. This makes it possible to realize the aforementioned control and communications functions with a comparatively small component, which can be integrated into the control and monitoring module. Of course the control and evaluation circuit can alternatively be discretely added on, too.

When considered from another aspect, the current invention is a system, especially a fire protection system, which has at least one actuator, a system control for supplying the actuator with signals, a power supply unit for supplying the actuator with electrical power, and at least one signal and/or supply line, which runs between the system control and/or the power supply unit and the at least one actuator. According to the present invention a control and monitoring module is assigned to the at least one actuator, whereby it is designed to monitor the at least one signal and/or supply line for faults and/or control the at least one actuator and/or simulate the control of the least one actuator.

The system is preferably a fire prevention system, for example a fire prevention, fire alarm or fire extinguishing system. A fire prevention system can for example reduce the risk of ignition in an area, by reducing the oxygen content in an enclosed space, especially by introducing air with reduced oxygen content. The fire prevention system includes along with machines for generating an oxygen-reduced stream of volume, as well a control unit for the regulated introduction of oxygen-reduced air. In a hazardous situation, for example, if the oxygen content in the enclosed area drops to a level that would be dangerous to human health, the control will initiate protective measures. These would include especially the control of actuators like alarms or valves, for example, so-called section valves, in order for example to facilitate the flow of reduced-oxygen air to the enclosed area, stop it again reliably or if needed to initiate a separate fresh air feed for rapidly increasing the oxygen content in the area.

A fire alarm system encompasses usually several fire alarms, which are communicatively connected with a supervening system control or central fire alarm unit. If one of the fire alarms detects a fire, for example, based on smoke, flames or heat, it will report this to the central fire alarm unit. It will respond to the message e.g. by engaging actuators as alarms and by sending out emergency calls.

An extinguishing system encompasses in general along with a reservoir of extinguishing agent and a line and nozzle system for distributing the extinguishing agent as well a system control, also referred to a extinguishing control panel. The extinguishing system can for example be a gas extinguishing system, which quenches the fire by introducing a high volume of gas (inert gas or chemical gas mixture). When it receives a hazard signal, e.g. a fire alarm, the system control triggers extinguishing. To this end it activates the alarm devices such as horns and flashing lights in order to initiate an evacuation, and will engage additional actuators such as section or bottle valves, to control the coordinated introduction of extinguishing agents.

All three of the aforementioned types of fire protection systems have in common that they use a system control to activate various actuators. These actuators are specifically alarm devices like horns, flashing lights and illuminated panels, but also servo devices such as valves, motor or door switches. To provide the actuators with power and signals, signal and supply lines are often used, for example in the form of two-wire or multi-wire lines between the system control and the actuators. Thereby a very wide variety of configurations is conceivable: For example, the system control can include an integrated power supply unit or be combined with a separate central power supply unit in a single housing. In each of these cases a signal and power supply line to the actuators can be provided. Alternatively, the signal and power supply can be provided over a shared line or in a joint cable. In another alternative, multiple decentralized power supply units can be provided in the system which supply both the system control and the actuators each over their own power supply line.

In all variants the signal and/or power supply lines must be monitored according to the above-mentioned requirements from standards and guidelines for a critically high or critically low line resistance at which a control function can no longer be reliably assured.

In the invention a control and monitoring module is assigned to the at least one actuator in the system. The system carries out as needed the control of the actuator as well as the monitoring of the signal and/or supply line for inadmissible high or low line resistance. To this end the control and monitoring module preferably includes a control device for activating the at least one actuator, a measuring device for determining the current and/or power consumption of the at least one actuator and for determining the actual voltage at the control and monitoring module and/or the actuator, as well as a testing device for simulating the current- and/or power consumption of the at least one actuator. The control and monitoring module is preferably so configured that a fault in the at least one signal and/or supply line to the control and monitoring module and/or to the at least one actuator assigned to the control and monitoring module will be detected if, during a simulation carried out by the testing device for the control and monitoring module, an actual voltage at the control and monitoring module and/or one of the actuators exceeds a previously specified upper voltage limit or drops below a previously specified lowed voltage limit.

Especially when there are repeated or successive detections of a fault in the signal and/or supply line by the control and monitoring module, it will send a fault message to the system control, for example over a communications interface of the control and monitoring module. The system control will take suitable measures when it receives such a fault message, for example, it will place the fault message on a central display, such as a control panel for the system, or it will send a fault message to a continuously manned station.

Alternatively or additionally, the system control for the systems can be designed to evaluate the measured electrical factors of the control and monitoring module as well as to compare the measured values with stored limits and thus to detect a fault in the signal and/or supply line. Here the system control will detect a fault if during a simulation performed by the testing device for the control and monitoring module an voltage at the control and monitoring module and/or an actual voltage at an actuators exceeds a previously specified upper voltage limit or drops below a previously specified voltage limit. In this variant the measuring device of the control and monitoring module determines the actual voltage at the control and monitoring module and/or to the at least one actuator and communicates the measured values for example via the signal and/or supply line, especially over a bus connected to the system control by means of a bus interface. This compares the readings received with the limits saved in the system control and detects a fault if one or more voltage readings exceeds or drops below one of the threshold values. Analogously other limits such as voltage or power limits can be stored in the system control; additionally, the learned values for a control and monitoring module that were learned in a learning mode can be transmitted to the system control and there compared with the matching threshold values. Likewise it is possible to reverse the direction of communication and control signals can to be sent by the system control to the activating, measuring and/or testing device of the control and monitoring module. When transmitting individual or all control and/or evaluation tasks from the module control device of the control and monitoring module to the system control, the control and monitoring module can be built smaller and built to be more cost-efficient.

In the preferred embodiments, the control device is designed to control the least one actuator in a learning mode and/or activation mode. It is advantageous that the measuring device be designed to determine in the learning mode and/or activation mode the current and/or power consumption of the at least one controlled actuators. The testing device can be designed to simulate in a monitoring mode the detected current and/or power consumption of the at least one actuator. In the monitoring mode the measuring device will determine, preferably, the actual voltage at the control and monitoring module and/or the at least one actuator.

Basically, it is advantageous if the system control of the system is designed, preferably, at or immediately after an initial operational start of the system, after maintenance or as needed to switch the control and monitoring module assigned to the at least one actuator to a learning mode in which the at least one actuator is controlled and the current and/or power consumption of the at least one actuator is determined. During the operational start of the system, one can assume with high probability that there are intact signal and supply lines as well as intact actuators, so that one can assume in the measurements that the initial condition of the system is accurately and therefore one can assume suitable learning values for the ongoing line-monitoring. Of course, the control and monitoring module can be switched into learning mode at a later time, for example in order to take into account in monitoring a changed total load on the system caused by adding or removing actuators at a later point in time.

The invention shows itself to be particularly advantageous if the system includes several control and monitoring modules in a single variant and either all modules in the systems or all modules on a specific power and/or signal supply line can be switched to learning mode at the same time through the system control of the system. This makes it possible to exactly and completely measure and evaluate the maximum current and/or power consumption in the systems or the line with all control and monitoring modules involved when they are in learning mode. Since, for example, during an alarm event, all alarms must be engaged simultaneously and the electrical power needed for this must be available to all distributed alarms at the same level at the same time, the system in the invention can represent this high load in a learning mode and the values measured can be used as the basis for subsequent line monitoring.

In a preferred embodiment of the system in the invention, the actual voltage at the control and monitoring module and/or the at least one actuator will be determined in the learning mode. This system variant increases the reliability of line monitoring since it makes it possible while learning the actuator-specific current and power values to carry out an additional test of the available voltage and makes it possible to immediately detect unsuitably long lines or an unsuitably large number of actuators for the system.

In another especially advantageous variant of the system in the invention, the system control is designed, preferably immediately after a learning mode, to switch the control and monitoring module assigned to the at least one actuator into a pre-testing mode in which the control and monitoring module assigned to the at least one actuator simulates the current and/or power consumption of the at least one actuator, the actual voltage at the control and monitoring module and/or the at least one actuator is determined and, on exceeding a previously specified upper voltage threshold value or dropping below a previously specified voltage threshold value, the simulated current and/or power consumption is manually or automatically adjusted. Thus, in this embodiment one also checks whether the learned values or those used for the simulation were determined correctly or if for example there was a measurement error or a calculation error, such as in determining the effective value. It is assumed that the system is in an intact state during a learning mode, meaning especially that there is no defect in the signal and power supply lines or the actuator. If nevertheless a voltage value is detected that is too high or too low, the simulated current and/or power consumption can be re-adjusted or fine-tuned, therefore re-set. Preferably this occurs automatically, for example program-based by means of a module control device in the form of a microcontroller. Alternatively, the readjustment can be done manually, for example directly on the module control device or indirectly using the system control. To this end, prompt for manual adjustment is sent on the part of the module or system control to a trained user when a too high or too low voltage value is detected.

Furthermore, it is an advantage if the system control is trained to switch the control and monitoring module assigned to the at least one actuator into a monitoring mode, especially cyclically. In monitoring mode the control and monitoring module assigned to the at least one actuator will determine the current and/or power consumption of the at least one actuator and determine the actual voltage at the control and monitoring module and/or the at least one actuator. Here the control and monitoring module is designed to detect a fault in the at least one signal and/or supply line, if, during a simulation, a voltage at the control and monitoring module and/or the actuator exceeds a previously specified upper voltage threshold value or drops below a previously specified lower voltage threshold value. In other words, the system control coordinates the particular time of the simulation through the testing device, whereby this is preferably repeated at regular intervals, that is, cyclically. For example, the system control switches the control and monitoring module into monitoring mode every 10 seconds. Of course the monitoring mode can be turned on as required for shorter or longer time periods. It is however alternatively or supplementally conceivable, that the system control switches the control and monitoring module based on certain events in the monitoring mode, for example following a power failure.

The invention proves especially advantageous if the system includes in one variant multiple control and monitoring modules and either all modules in the systems or all modules on a specific power and/or signal supply line can be switched simultaneously by the system control of the system into monitoring mode; it simulates and evaluates the entire and/or maximum current and/or power consumption of the systems and/or the line with all involved control and monitoring modules in monitoring mode. If in an alarm event, for example, all the alarms have to be switched on at the same time, the system according to the invention with the monitoring mode as described here will reliably detect even before such an alarm event, whether the electrical power required for this is available at a sufficient level at all actuators and/or alarms distributed in the system.

According to the preferred embodiments of the system in the invention, the system control will be designed to switch the control and monitoring module assigned to the at least one actuator in an activation mode, in which the control and monitoring module controls the at least one actuator. The switch into activation mode can for example be trigged by a fire alarm in a system configured as a fire alarm system; or by falling below a lower oxygen threshold value, which can mean a need for reduced-oxygen air supply or indicate that warning or evacuation is necessary in a system configured as a fire prevention system; or by an extinguishing initiation signal in a system configured as an extinguishing system. In activation mode, the control and monitoring module will switch the power supply applied to the module through to the at least one actuator, so that it generates the desired actuator output, for example, opening a valve or activating flashing lights, horns or illuminated panels to fulfil its alarm function. This embodiment shows especially clearly the preferred double function of the control and monitoring module which makes possible first, the reliable control of the actuators in the system and second the reliable monitoring of the energy supply lines to the actuators.

In one embodiment of the system in the invention, the system comprises are least two control and monitoring modules with at least one actuator each. Here the system control is designed to detect a fault in the at least one signal and/or supply line when a measuring device in at least one of the control and monitoring modules detects that current, power or voltage upper threshold values have been exceeded or the lower threshold have been undercut. Preferably the system control can also localize the fault in the system.

This variant reflects the practical case that, for example, a system configured as a fire prevention system, fire alarm system or extinguishing system has more than one actuator and so for example more than one horn, flashing light or illuminated panel and/or more than one valve or door switch. Single or paired control and monitoring modules in this example are assigned to the several actuators. If a fault in the signal and/or supply line is detected by means of the control and monitoring module, the system control can localize the fault, for example, through serial queries or giving commands to the control and monitoring modules and/or the actuators assigned to them or for example through systematic evaluation of the fault messages received from the control and monitoring module. During such a localization procedure the system control can for example determine on which line section and/or between which control and monitoring modules a defect in the signal and/or supply line is located or which actuator is causing a short circuit.

The present invention furthermore also involves a method for operating a control and monitoring module for activating at least one of the actuators assigned to the control and monitoring module and for monitoring at least one signal and/or supply line to the control and monitoring module and/or to the at least one actuator. The method according to the present invention comprises the following method steps:

Activating the at least one actuator determining the current and/or power consumption of the at least one actuator in a learning mode;

Simulating the current and/or power consumption of the at least one actuator determined in learning mode and determining the actual voltage at the control and monitoring module and/or to the actuator in a preferably cyclically activated monitoring mode;

Activating of the at least one actuator in an activation mode initiated as needed.

In the method according to the invention, it is possible for the first time to carry out with a combined control and monitoring module firstly the reliable control of at least one actuator and secondly particularly reliable monitoring of signal and/or supply lines to the module and (/or to the at least one actuator. Only a few procedural steps are necessary to this end, namely an initial activating of the at least one actuator, preferably of several actuators at the same time, measuring of its/their current and/or power consumption as well as subsequent simulation of the measured current and/or power readings and determining the actual voltage at the control and monitoring module and/or to the actuators for a realistic line test. Of course the at least one actuator can be really controlled at any time as necessary in order to fulfil its function as an actuator, for example as an alarm device or servo device.

In a particularly advantageous alternative, the method is designed so that the procedural steps for multiple control and monitoring modules, for example several or all control and monitoring modules in a fire protection system, can be executed at the same time. This means that, for several control and monitoring modules, activating can be executed at the same time in a learning mode and/or at the same time a simulation in a monitoring mode and/or san activation is executed simultaneously in an activation mode. This makes it possible to assure that monitoring of at least one signal and/or supply line to the control and monitoring modules is executed with the exact and total or maximum current and/or power consumption values.

In a preferred embodiment of the method, at least two actuators are assigned to the control and monitoring module, whereby for one of the actuators the activation mode and or the other at least one more actuators the monitoring mode or whereby for one actuator the monitoring mode and for the at least one more actuators the activation mode can be executed at the same time. The at least two actuator are hereby switched parallel. This makes it possible for the first time to be able to carry out a line test for other actuators during an actuation event, in that the additional current and/or power consumption of a not-controlled actuator can also be simulated as a controlled actuator. This advantage is especially pronounced in the event that the actuator is a illuminated panel since illuminated panels have to be constantly supplied with electrical power (e.g. to constantly display a notification of a low-oxygen area). In this case, the line monitoring for additional actuators that are connected to the same control and monitoring module can be reliably assured.

In the following exemplary embodiments of the control and monitoring module according to the invention are described in greater detail based on the enclosed drawings.

Figure 2A:
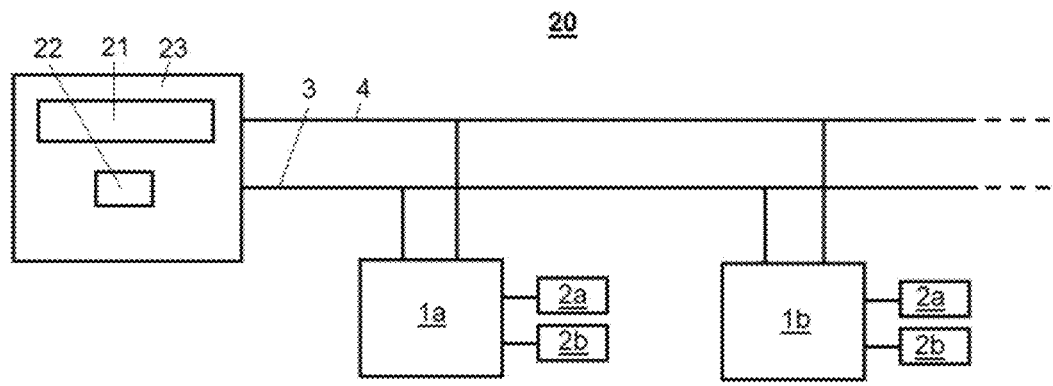
Figure 2B:
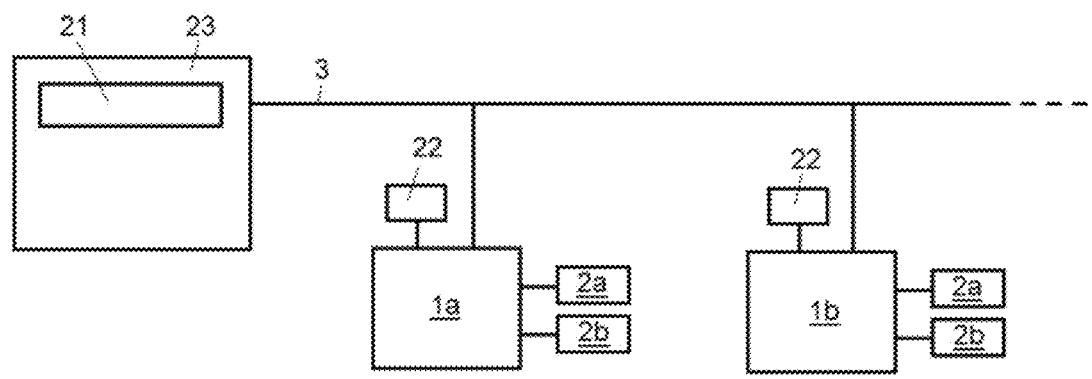
Figure 3A:
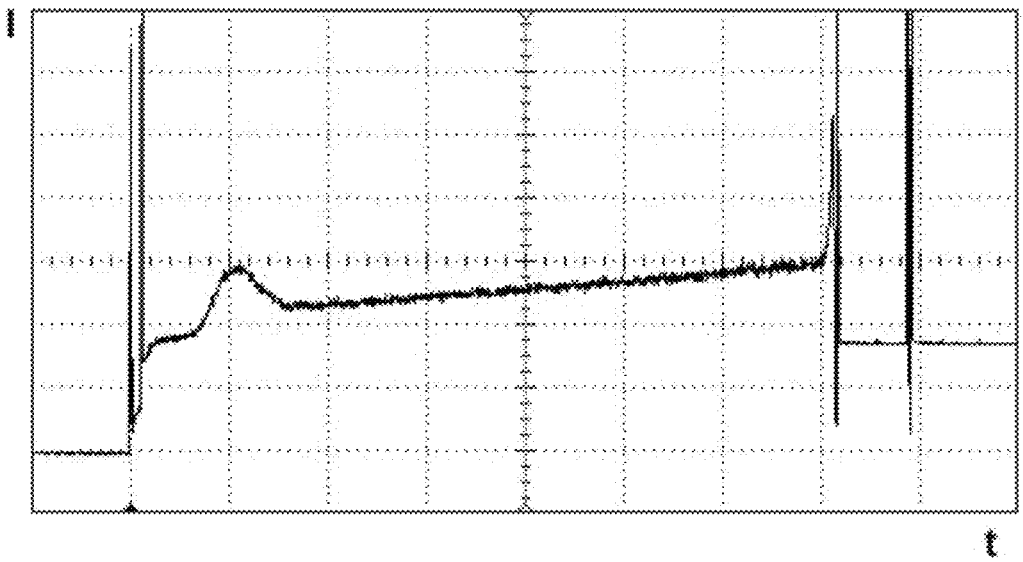
Figure 3B:
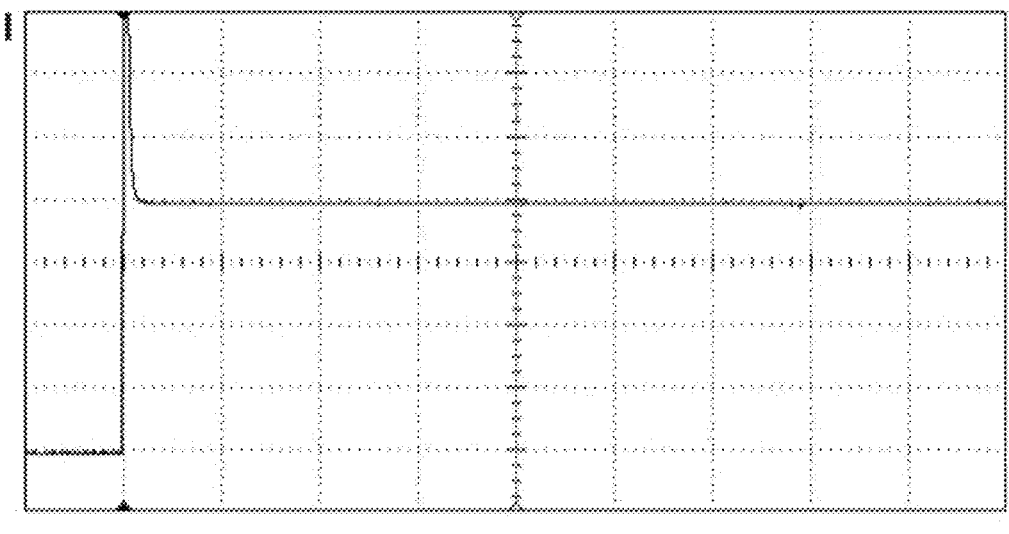
Figure 3C:
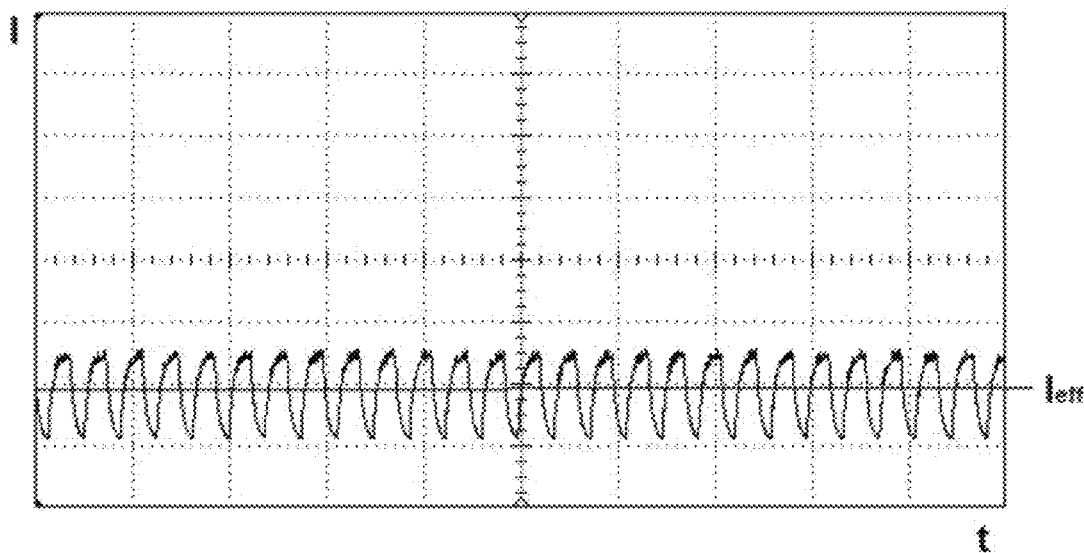
Figure 3D:
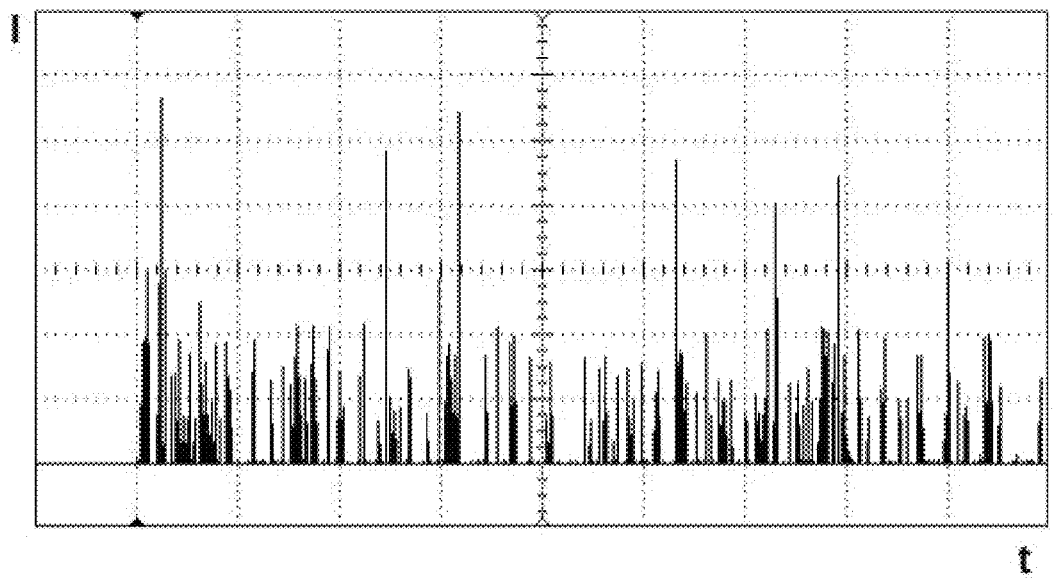
Figure 3E:
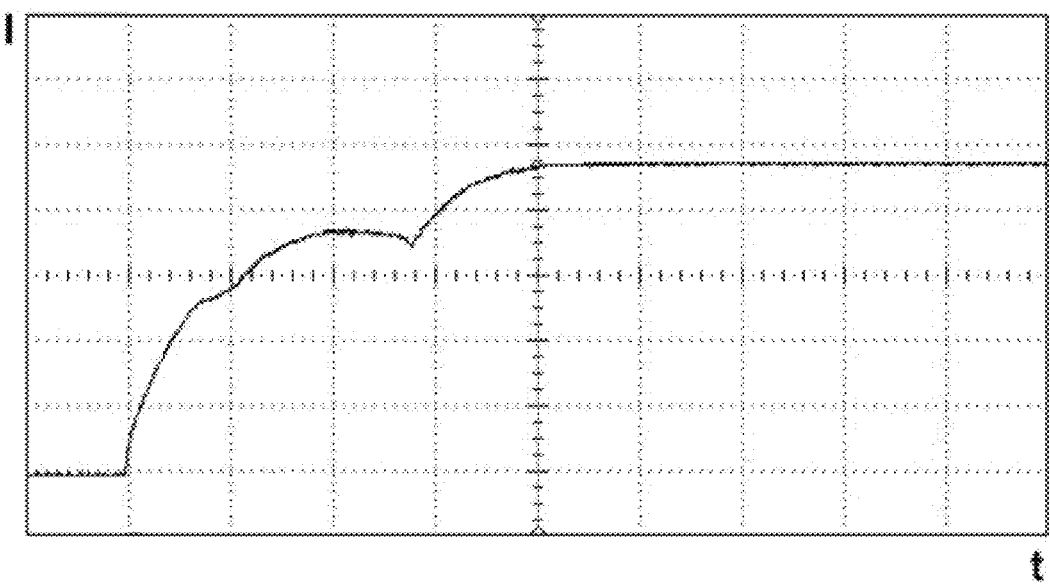
Figure 4:
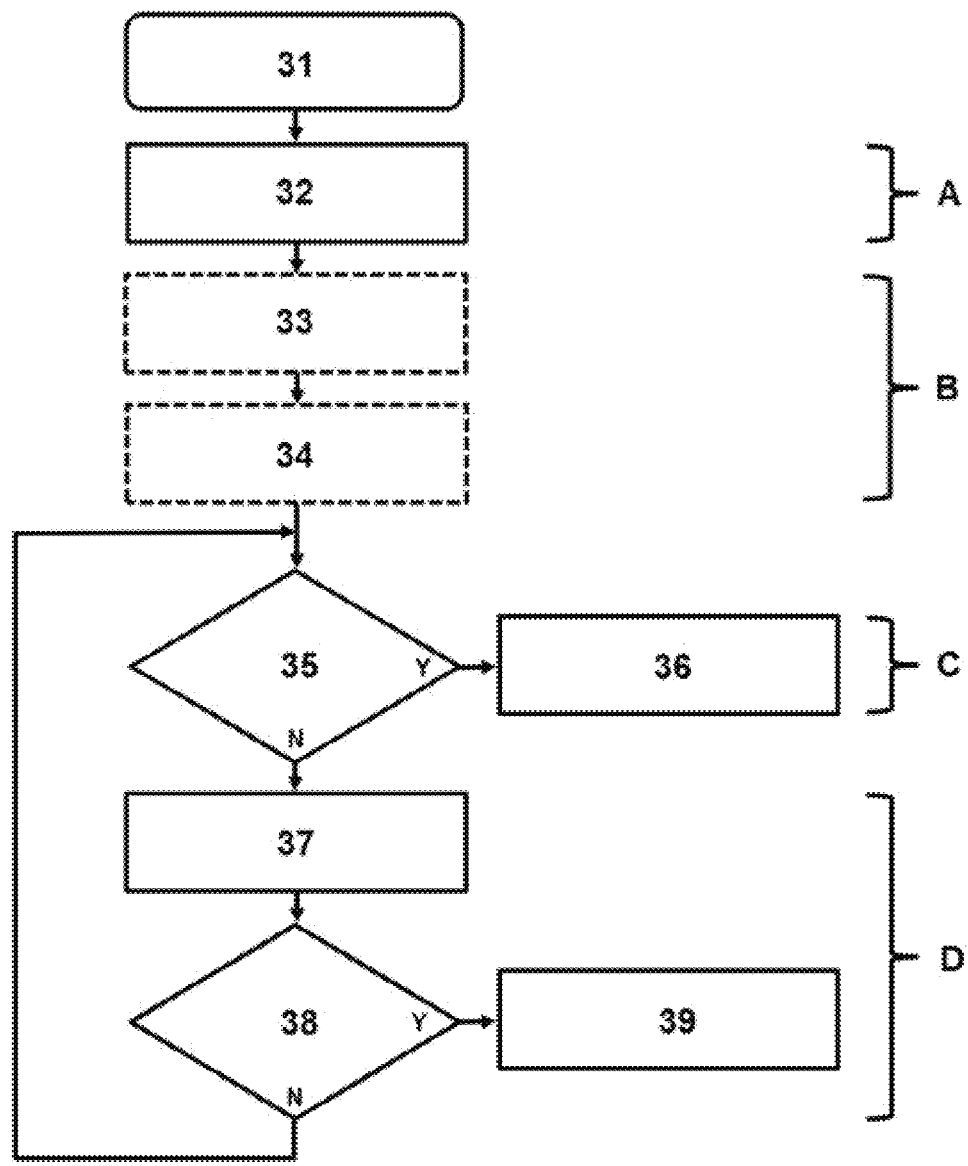

They show:

FIG. 1 diagram of an exemplary embodiment of a control and monitoring module according to an exemplary embodiment of the invention;

FIG. 2a diagram of a first exemplary embodiment of the system according to the invention with multiple control and monitoring modules according to the invention;

FIG. 2b diagram of a second exemplary embodiment of the systems according to invention with multiple control and monitoring modules according to the invention;

FIG. 3a-e examples of the chronological sequence of the current consumption of the different actuators in their respective activated states; and FIG. 4 outline of a flow chart for explaining an exemplary embodiment of the method according to the invention.

The diagram shown in the drawings of the control and monitoring module represented 1; 1a, 1b serves for activating actuators 2a, 2b, such as for example alarm devices or servo devices, as well as for monitoring the signal and/or supply lines 3, 4 which lead to these actuators en 2a, 2b. The control and monitoring module 1; 1a, 1b according to the exemplary embodiments monitors the signal and/or supply lines 3, 4 according to standard EN 54-13 2005 for elevated or reduced line resistance, at which a control function can no longer be assured. It is preferably located in the immediate proximity of actuators 2a, 2b and for example connected to actuators 2a, 2b through short control lines just a few centimeters long or through direct plug connectors. The control and monitoring module 1; 1a, 1b is constructed in such a way that it reports a fault if e.g. a connected signal and/or supply line can no longer carry out the intended control function for the corresponding actuators 2a, 2b due to an inadmissible high or low line resistance.

According to exemplary embodiments of the current invention, a control and monitoring module 1; 1a, 1b is needed for each actuator 2a, 2b, which monitors the signal and/or supply line 3, 4 to these actuators 2a, 2b and/or to the control and monitoring module 1; 1a, 1b. In the case of valves, it can be especially efficient due to the complex current and power consumption, to assign them each their own control and monitoring module 1; 1a, 1b. According to other embodiments, two or more actuators 2a, 2b can be assigned to each control and monitoring module 1; 1a, 1b, whereby then this control and monitoring module 1; 1a, 1b correspondingly monitors the signal and/or supply lines 3, 4 of the actuators 2a, 2b. For example, a shared control and monitoring module 1; 1a, 1b can, for reasons of cost alone, be especially well-suited for combinations of alarm devices, such as consisting of flashing light and horn, or illuminated panel combinations such as on the interior and exterior side of a door.

FIG. 1 shows the diagram of the represented control and monitoring module with its primary components (shown with the solid lines) as well as other advantageous components (shown with dotted lines). The control and monitoring module 1 depicted in the FIG. 1 diagram is assigned to an actuators 2a, for example a horn, as well optionally an additional actuator 2b, for example a flashing light. The control and monitoring module 1 serves for monitoring the signal line 3 and/or supply line 4 for elevated and/or reduced line resistance, at which a control function can no longer be reliably assured. It also serves to control the actuator 2a, 2b. The control and monitoring module 1 contains one or more control devices 9, here shown in the form of circuits, which switch through the electrical power supplied over a supply line 4 into a learning mode or if needed into an activation mode via actuator outputs 10a, 10b to the actuators 2a, 2b and thus activates them. The control and monitoring module 1 furthermore includes a measuring device 8 configured as a discrete circuit for measuring electrical factors such as current, voltage and power, here represented symbolically by an amperemeter 8a, a voltmeter 8b and a Wattmeter 8c. The measuring device 8 serves primarily to determine current and/or power consumption of the at least one actuator s 2a, 2b and to determine the actual voltage at the control and monitoring module 1 and/or the actuators 2a, 2b. Furthermore the control and monitoring module 1 includes a testing device 11 for simulating a previously measured current and/or power consumption for the connected actuators 2a, 2b. In example shown here, the testing device 11 is configured as a current sink.

Subsequently, the control and monitoring module 1 of the invention includes according to FIG. 1 at least one control device 9 for activating the actuators 2a, 2b, a measuring device 8 for determining the current and/or power consumption of the least one actuator 2a, 2b and for determining an actual voltage at the control and monitoring module 1 and/or to the actuator 2a, 2b as well as a testing device 11 for simulating a current and/or power consumption of the at least one actuator 2a, 2b. Thereby the control and monitoring module 1 is designed to detect a fault in the at least one signal and/or supply line 3, 4 to the control and monitoring module 1 and/or to the actuators 2a, 2b, if, in a simulation carried out by the testing device 11 of the control and monitoring module 1, an actual voltage at the control and monitoring module 1 and/or to the actuators 2a, 2b exceeds a previously specified upper voltage threshold value or drops below a previously specified lower threshold value.

The control and monitoring module 1 shown also detects a fault in the at least one signal and/or supply line 3, 4, if during an activation event of the at least one actuator s 2a, 2b a current consumption of the at least one actuator 2a, 2b exceeds a previously specified upper current threshold value or drops below a previously specified lower current threshold value and/or if a power consumption of the at least one actuator 2a, 2b exceeds a previously specified upper power consumption threshold value or drops below a previously specified lower power consumption threshold value and/or if an voltage at the control and monitoring module 1 and/or the actuator 2a, 2b exceeds a previously specified upper voltage threshold value or drops below a previously specified lower voltage threshold value.

Preferably the control and monitoring module 1 will generate an error and/or fault message if it repeatedly and especially successively detects a fault in signal and/or supply line 3, 4.

The control and monitoring module 1 preferably includes a communication device 7, which for example can be executed as a bus interface. Signal line 3 is then a bus line, for example, a Modbus. Using the communication device 7 and the signal line 3 and/or bus line, the control and monitoring module 1 can communicate with components of a system not further shown in FIG. 1, for example, with system controls for a fire alarm or fire prevention system or an extinguishing system.

For controlling the various components of the control and monitoring module 1, that is for the power supply and communication with them as well as e.g. for the evaluation of measurement data, e.g. comparing measured values with threshold values, the control and monitoring module 1 has a module control device 6, specifically a microcontroller. It preferably has an internal memory device 12, in which for example a program for the various controlling sequences and for evaluating signals and data is stored. The limits required for the line monitoring according to the invention can also be stored in the memory storage device 12. With an optional selection or configuration option for the limits, it is also possible to provide e.g. a DIP-switch for manual selection or configuration.

The control and monitoring module 1 is executed in FIG. 1 as a compact module with a housing 5, whereby connections for the signal line 3 and the supply line 4 as well as for actuators 2a, 2b are provided on the compact module.

The control device 9 of the control and monitoring module shown in FIG. 1 is designed to control the actuators 2a, 2b in a learning mode and/or an activation mode. Additionally the measuring device 8 is designed to determine the current and/or power consumption of the actuators 2a, 2b in learning mode and/or activation mode. The testing device 11 serves to simulate the current and/or power consumption of actuators 2a, 2b determined in a monitoring mode. In the monitoring mode, the measuring device 8 will determine the actual voltage at the control and monitoring module 1 and/or to actuators 2a, 2b.

In FIG. 2a one sees a diagram of a first exemplary embodiment of the system 20 according to the invention. This system 20 is for example a fire protection system in the form of a fire alarm system, fire prevention system or extinguishing system.

System 20 comprises a system control 21 and power supply 22 combined in a single housing 23. Via the separately executed signal line 3 and supply line 4 shown in FIG. 2a, additional components of systems 20 such as control and monitoring modules 1a, 1b with connected actuators 2a, 2b are supplied with data and power. FIGS. 2a, 2b show the connection between the system control 21 and the other system components as a branch line. Of course, other topologies are conceivable here as well, for example a ring structure in which the signal and supply lines 3, 4 feeds back to the housing 23 with the system control 21. It is also possible to provide several branch or ring lines as signal and supply lines (3, 4) in the system (20).

Preferably, the system 20 includes two or more control and monitoring modules 1a, 1b as well as multiple actuators 2a, 2b. The displayed system 20 is for example constructed as a fire prevention system, so that for example the actuators 2a, 2b of system 20 are on the one hand alarm devices such as horns, flashing lights and illuminated panels, and on the other hand valves, especially section valves.

The control and monitoring modules 1a, 1b used in system 20 correspond in structural and functional respect to module 1 referred to in the illustration in FIG. 1. To avoid repetition, we refer back to the previous explanations.

With the individual control and monitoring modules 1a, 1b it is possible with the system 20 described in the invention, to detect a corresponding fault in the signal and supply lines 3, 4. Due to the parallel arrangement of the control and monitoring modules 1a, 1b at the at least one signal and/or supply line 3, 4, both line monitoring or a fault localization are possible. If the resistance in the signal or supply line 3, 4 is inadmissibly high for some reason, the downstream participants (control and monitoring modules 1a, 1b) will report a fault; by way of contrast, the participants upstream of the fault (control and monitoring modules 1a, 1b) will not report a fault. In this way, the fault in the branch line 3, 4 can be localized to energy and signal supply.

During the learning process all actuators 2a, 2b as shown in the drawings diagram of the represented exemplary embodiments of system 20 in the invention are simultaneously activated by system control 21. This simultaneous activation during the learning process is preferred in order to take the whole power consumption of system 20 into account. In the execution of signal line 3 as a bus line, it is possible to realize according to many communications protocols a simultaneous activation by means of a so-called broadcast-command.

In a preferred variant, the monitoring mode is also transmitted simultaneously in all control and monitoring modules 1a, 1b, in that the system control 21 switches all modules 1a, 1b for example by means of a broadcast-command into the monitoring mode, in which, as described above, the appropriate current and/or power consumption in each module 1a, 1b is simulated as determined in the learning process.

In an activation mode by contrast all actuators 2a, 2b in the system 20 are controlled via the assigned control and monitoring modules 1a, 1b in sequence and specifically in that system control 21 either directly triggers all control and monitoring modules 1a, 1b in sequence or distributes a broadcast, which the control and monitoring modules 1a, 1b implement with their specifically assigned time delay. If, in this scenario, a short circuit occurs in one of the actuators 2a, 2b in system 20, it detects that the control and monitoring module 1a, 1b assigned to these actuators 2a, 2b comprises a voltage that is too low or a current that is too high and will preferably immediately separate the actuators 2a, 2b from the power supply. Additionally, the corresponding control and monitoring module 1a, 1b sends a short-circuit notification via the communication device 7 of the control and monitoring module 1a, 1b to the system control 21.

According to the embodiments of the system 20 in the invention, some actuators 2a, 2b will be permanently controlled, which can be the case if the actuators in 2a, 2b are executed as illuminated panels. However, thanks to the execution of the control and monitoring modules 1a, 1b as defined by the invention can be implemented for the other actuators 2a, 2b simultaneous line monitoring can be implemented by means of control device 9, testing device 11 and measuring device 8.

In FIG. 2b shows a diagram of another exemplary embodiment of system 20 in the invention. This additional exemplary embodiment of system 20 in the invention essentially matches in the structural and functional respects the system 20 shown in FIG. 2a, with the exception that the individual control and monitoring modules 1a, 1b of the system 20 is not supplied preferably with electrical power over a shared supply line 4. Moreover, it is provided in the exemplary embodiment according to FIG. 2b that the control and monitoring modules 1a, 1b are connected with the decentralized power supply units 22, whereby not just an individual power supply can be assigned to each control and monitoring module 1a, 1b as shown in FIG. 2b, but that also several control and monitoring modules 1a, 1b can share multiple joint power supply units 22. A decentralized power supply basically has the advantage of short line lengths and thus a lower amount of cost and effort involved in installation and maintenance.

In FIGS. 3a to 3e one sees the chronological sequences of current uptake from the different actuators 2a, 2b when they are engaged.

In detail one sees in

FIG. 3a the chronological sequence of current uptake of an actuator;

FIG. 3b the chronological sequence of current uptake of a flashing light;

FIG. 3c the chronological sequence of current uptake of a illuminated panel;

FIG. 3d the chronological sequence of current uptake of a siren; and in

FIG. 3e the chronological sequence of current uptake of a value.

It is clearly visible that the different actuators 2a, 2b evince a characteristic current and/or power consumption when they are activated. Due to the complexity of the different characteristics of the actuators 2a, 2b it is therefore preferred, if the measuring device 8 of the respective control and monitoring modules 1a, 1b of the systems 20 in the invention, detect especially in a learning mode of the specific control and monitoring module 1a, 1b, a chronological sequence of a current uptake of the at least one actuator 2a, 2b assigned to the corresponding control and monitoring module 1a, 1b in its activated state and/or determines a chronological sequence of a power consumption of the at least one actuator 2a, 2b assigned to the specific control and monitoring module 1a, 1b in its activated state.

It is especially preferred if the measuring device 8 determines in the learning mode an effective value for the current and/or power consumption of actuator 2a, 2b whereby the testing device 11 is designed to simulate the determined effective value of the current and power consumption of the at least one actuator 2a, 2b in the monitoring mode. The term effective value is understood to mean an electrical unit which implements at a consumer the same electrical power in a representative time span, e.g. 10 to 20 seconds, or the same electrical output. In FIG. 3c, for example, such an effective value is delineated as $I_{eff}$ a constant substitute value for the current consumption measured over the time frame.

In the following an embodiment of the method in the invention is described in greater detail with reference to the flowchart according to FIG. 4.

Specifically, the sequence of a method for operating a control and monitoring module 1, 1a, 1b is shown in the diagram in FIG. 4 diagram; it is for activating at least one of the actuators 2a, 2b assigned to the control and monitoring module 1; 1a, 1b and for monitoring at least one signal and/or supply line 3, 4 to the control and monitoring module 1; 1a, 1b and/or to the at least one actuator 2a, 2b of the control and monitoring module 1; 1a, 1b.

Preferably, the method begins with step 31 of commissioning or servicing the control and monitoring module 1; 1a, 1b and/or system 20. In a learning mode A, the control and monitoring module 1; 1a, 1b activates in step 32 by means of a control device 9 the at least one assigned actuator 2a, 2b and measures the current and/or power consumption of the activated actuator 2a, 2b by means of a measuring device 8. In an optional pre-test mode B that immediately follows learning mode A, the testing device 11 of the control and monitoring module 1; 1a, 1b simulates in step 33 the just-determined current and/or power consumption of the at least one actuator 2a, 2b. Thereby the actual voltage at the control and monitoring module and/or the at least one actuator is determined and when it exceeds a previously specified upper voltage threshold value or if it undercuts a previously specified lower voltage threshold value, the simulated current and/or power consumption will be automatically adjusted in a step 34. In this embodiment, thus, it also checks to determine if the learned values and/or those used for the simulation were correctly determined or if for example there has been a faulty reading or an error in calculation, perhaps in determining the effective value. Hereby it is assumed that the system 20 is intact during a learning mode A, that is, that there is especially no defect in the signal and energy supply lines 3, 4 or the actuator 2a, 2b. If, however a fault is reported due to a too high or too low voltage value, the simulated current and/or power consumption can be readjusted or fine-tuned, i.e. corrected. This can be done in particular automatically, for example, program-based with the support of a module control device 6 executed as a microcontroller, or alternatively can also be done manually.

In an additional operation of the control and monitoring module 1; 1a, 1b, there is in step 35 for example continuous or cyclical monitoring by a module control device 6, to detect if there is a control command, for example from a system control 21. If a control command is detected, the control and monitoring module 1; 1a, 1b switches into an activation mode C, in which the connected actuators 2a, 2b are controlled and/or activated by switching through a power supply to the actuators 2a, 2b. If no control command is detected, the control and monitoring module 1; 1a, 1b will switch into a monitoring mode D. In this mode, a testing device 11 simulates in Step 37 the current and/or power consumption of the connected actuators in 2a, 2b and measures the actual voltage at the control and monitoring module 1; 1a, 1b and/or to the actuators 2a, 2b. In step 38 of the monitoring mode, the control and monitoring module 1; 1a, 1b compares, for example by means of a module control device 6 as well as an integrated memory storage device 12 the measured voltage values with the saved upper and lower voltage threshold values. If a threshold value is exceeded or undercut, especially in cases where this variation is repeated or occurs successively, the control and monitoring module 1; 1a, 1b transmits a fault message in a step 39, for example over a communication device 7. If the reading does not drop below or exceed a threshold value, the control and monitoring module 1 returns to the test done in step 35 to determine if there is a control command.

The invention is not limited to the embodiments depicted in the drawings of the exemplary embodiments, but emerges from a holistic consideration of all characteristics disclosed herein.

What is claimed is:

1. A control and monitoring module for activating an actuator assigned to the control and monitoring module and for monitoring a signal line and/or a power supply line connected to the control and monitoring module and/or to the actuator, the control and monitoring module comprising:
   a control device configured to activate the actuator;
   a measuring device configured to determine a current and/or power consumption of the actuator and to determine an actual voltage at the control and monitoring module and/or the actuator; and
   a testing device configured to execute a simulation of the determined current and/or power consumption of the actuator,
   wherein the control and monitoring module is configured to detect a fault in the signal line and/or the power supply line, if, during the simulation executed by the testing device, an actual voltage at the control and monitoring module and/or the actuator exceeds a specified upper voltage threshold value or drops below a specified lower voltage threshold value.

2. The control and monitoring module of claim 1, wherein the control and monitoring module is further configured to detect a fault in the signal line and/or the power supply line, if at least one of the following conditions is met when the actuator is driven:
   (a) a current consumption of the actuator exceeds a specified upper current threshold value or drops below a specified lower current threshold value;
   (b) a power consumption of the actuator exceeds a specified upper power consumption threshold value or drops below a specified lower power consumption threshold value; or
   (c) an actual voltage at the control and monitoring module and/or the actuator exceeds a specified upper voltage threshold value or drops below a specified lower voltage threshold value.

3. The control and monitoring module of claim 1, wherein the control and monitoring module further includes a memory storage device for storing one or more of:
   a determined current and/or power consumption of the actuator;
   a determined actual voltage at the control and monitoring module and/or the actuator;
   a specified upper current threshold value and/or a specified lower current threshold value;
   a specified upper power consumption threshold value and/or a specified lower power consumption threshold value; and
   the specified upper voltage threshold value and/or the specified lower voltage threshold value.

4. The control and monitoring module of claim 1, wherein:
   the control device is configured, in a learning mode and/or an activation mode, to activate the actuator, and the measuring device is configured in the learning mode and/or the activation mode to determine the current and/or power consumption of the actuator when activated by the control device; and/or
   the testing device is configured, in a monitoring mode, to simulate a determined current and/or power consumption of the actuator, and the measuring device is configured in the monitoring mode to determine the actual voltage at the control and monitoring module and/or the actuator.

5. The control and monitoring module of claim 4, wherein the measuring device is configured in the learning mode and/or the activation mode to determine the actual voltage at the control and monitoring module and/or at the actuator.

6. The control and monitoring module of claim 4, wherein the measuring device is configured in the learning mode to determine a chronological sequence and/or an effective value (Jeff) for the current and/or power consumption of the actuator, and the testing device is configured to simulate in the monitoring mode the effective value (Jeff) or the chronological sequence of the current and/or power consumption of the actuator determined in the learning mode.

7. The control and monitoring module of claim 1, further comprising a communication device configured to communicatively link the control and monitoring module with a system control over the signal line.

8. The control and monitoring module of claim 1, wherein one or more of:
   the control device comprises switching circuitry;
   the measuring device comprises circuitry for measuring one or more of current, voltage, and power; and the testing device comprises circuitry for providing an ohmic load, an electronic load, or a current sink.

9. The control and monitoring module of claim 1, further comprising a module control device comprising a programmable module and a memory device, and a program stored in the memory device that when executed by the programmable module causes the control and monitoring module to detect the fault in the signal line and/or the supply line; and
wherein the programmable module comprises a programmable logic device, a microcontroller, or a microprocessor; and/or the programmable module is in communication with a dual in-line package (DIP) switch configurable to select threshold values.

10. The control and monitoring module of claim 1, further comprising a second control device configured to activate a second actuator assigned to the control and monitoring module;
wherein the testing device is configured in a monitoring mode to simulate an additional current and/or power consumption of one of the actuator and the second actuator that is not activated, and
the measuring device is configured in the monitoring mode to determine the actual voltage at the control and monitoring module and/or the first actuator or the second actuator.

11. A system for monitoring and controlling one or more actuators for a fire
protection system, comprising:
the control and monitoring module of claim 1;
an actuator assigned to the control and monitoring module;
a system control for supplying the actuator with signals;
a power supply for supplying the actuator with electrical power; and
a signal line and/or a power supply line connecting the system control and/or the power supply to the actuator,
wherein the control and monitoring module is configured to monitor the signal line and/or the power supply line for faults, to activate the actuator, or to simulate an activation of the actuator, or a combination thereof.

12. The system of claim 11, wherein the system control is configured to switch the control and monitoring module into a learning mode, in which the control and monitoring module activates the actuator, and the control and monitoring module is configured to determine the current and/or power consumption of the actuator, the actual voltage at the control and monitoring module and/or the at least one actuator, or a combination thereof, and the system control is configured to switch the control and monitoring module into the learning mode during or immediately after an initial operational start of the system, after maintenance, or as needed.

13. The system of claim 12, wherein:
the system control is configured, after the learning mode, to switch the control and monitoring module assigned to the actuator into a pre-test mode to simulate the current and/or power consumption of the actuator, and to determine the actual voltage at the control and monitoring module and/or the actuator; and
the control and monitoring module is configured to adjust the simulated current and/or power consumption when the actual voltage exceeds a specified upper voltage threshold value or drops below a specified lower voltage threshold value.

14. The system of claim 12, further comprising at least a further actuator assigned to the control and monitoring module, and in the learning mode, the control and monitoring module is configured to activate the actuator and the further actuator or to determine the current and/or power consumption of the actuator and the further actuator at a same time.

15. The system of claim 12, further comprising at least two control and monitoring modules each with at least one actuator; and
wherein the system control is configured to switch the control and monitoring modules into the learning mode at a same time.

16. The system of claim 11, wherein the system control is configured to switch the control and monitoring module into an activation mode in which the control and monitoring module activates the actuator.

17. The system of claim 11, further comprising at least two control and monitoring modules each with at least one actuator; and
wherein the system control is further configured to switch the control and monitoring modules at the same time into a monitoring mode, to simulate the current and/or power consumption of the actuators simultaneously, and to determine the actual voltage at the control and monitoring modules and/or the actuators simultaneously; and
wherein the control and monitoring modules are configured to detect a fault in the signal line and/or the power supply line, when, during a simulation, an actual voltage at one of the control and monitoring modules and/or the actuators exceeds the specified upper voltage threshold value or drops below the specified lower voltage threshold value.

18. The system of claim 11, further comprising at least two control and monitoring modules each with at least one actuator; and
wherein the system control is configured, when a measuring device of at least one of the control and monitoring modules detects a current, power, or voltage exceeding an upper current threshold value, power threshold value, or voltage threshold value, or falling below a lower current threshold value, power threshold value, or voltage threshold value, to register a fault in the signal line and/or the power supply line, and to localize of the fault in the system.

19. The system of claim 11, wherein:
the system control is configured to provide signals to the actuator for a fire alarm system, a fire prevention system, or a fire extinguishing system; or
the actuator assigned to the control and monitoring module is an alarm device, a flashing light, a horn, a siren, an illuminated panel, a servomotor device, a valve, or a door switch.

20. A method for operating a control and monitoring module for activating at least one actuator assigned to the control and monitoring module and for monitoring at least one signal line and/or power supply line connected to the control and monitoring module and/or to the at least one actuator, comprising:
(a) activating an actuator and determining a current and/or power consumption of the actuator in a learning mode;
(b) virtually simulating the current and/or power consumption of the actuator determined in the learning mode and determining an actual voltage at the control and monitoring module and/or at the actuator in a monitoring mode, and optionally in a cyclically-initiated monitoring mode; and (c) activating the actuator in an activation mode as needed.

\* \* \* \* \*